(12) United States Patent
Nakazato

(10) Patent No.: US 8,981,799 B2
(45) Date of Patent: Mar. 17, 2015

(54) CURRENT MEASURING CIRCUIT

(75) Inventor: Yukihira Nakazato, Kanagawa (JP)

(73) Assignee: Netcomsec Co.Ltd, Tokyo (JP)

( * ) Notice: Subject to any disclaimer, the term of this patent is extended or adjusted under 35 U.S.C. 154(b) by 541 days.

(21) Appl. No.: 12/624,181

(22) Filed: Nov. 23, 2009

(65) Prior Publication Data

US 2010/0127720 A1    May 27, 2010

(30) Foreign Application Priority Data

Nov. 25, 2008    (JP) .................................. 2008-299435

(51) Int. Cl.
  *G01R 31/40*    (2014.01)
  *G01R 19/00*    (2006.01)
  *H01J 25/02*    (2006.01)

(52) U.S. Cl.
  CPC ........... *G01R 19/0092* (2013.01); *H01J 25/025* (2013.01); *G01R 31/40* (2013.01)
  USPC ..................................... 324/713; 324/123 R

(58) Field of Classification Search
  CPC .... G01R 19/0092; G01R 31/40; H01J 25/025
  USPC ......................................................... 324/713
  See application file for complete search history.

(56) References Cited

U.S. PATENT DOCUMENTS

| | | | |
|---|---|---|---|
| 7,135,891 B2 * | 11/2006 | Grasso et al. | 327/50 |
| 7,353,410 B2 * | 4/2008 | Desai et al. | 713/300 |
| 7,489,084 B2 * | 2/2009 | Kobayashi et al. | 315/3.5 |
| 7,948,298 B2 * | 5/2011 | Kameyama et al. | 327/513 |
| 2006/0049854 A1 | 3/2006 | Grasso et al. | |
| 2008/0231197 A1 * | 9/2008 | Chiba et al. | 315/106 |

FOREIGN PATENT DOCUMENTS

| | | |
|---|---|---|
| JP | 56-116252 A | 9/1981 |
| JP | 3-43243 U | 4/1991 |
| JP | 07-320651 A | 12/1995 |
| JP | 08-249077 A | 9/1996 |
| JP | 2606104 B | 2/1997 |
| JP | 2711897 B | 10/1997 |
| JP | 2711897 B2 | 10/1997 |

(Continued)

OTHER PUBLICATIONS

The Extended European Search Report of EP Application No. 09014185.4 dated on Apr. 4, 2014.

(Continued)

*Primary Examiner* — Jeff Natalini
(74) *Attorney, Agent, or Firm* — Sughrue Mion, PLLC

(57) ABSTRACT

A first resistor, a second resistor, a transistor, and a third resistor connected in series between a ground potential and an output terminal of a power circuit are provided. In addition, a current-detecting resistor is inserted in series between a high-voltage site and an output terminal of a power circuit that supplies a predetermined direct voltage to the high-voltage site. A differential amplifier controls a current flowing through the transistor so that a potential difference generated between both ends of the third resistor becomes proportional to a potential difference generated between both ends of the current-detecting resistor. At this point, by measuring the voltage of a connection node of the first resistor and the second resistor, the value of a current flowing through the high-voltage site can be calculated from the measured value.

12 Claims, 9 Drawing Sheets

(56) References Cited

FOREIGN PATENT DOCUMENTS

| | | |
|---|---|---|
| JP | 2000118476 A | 4/2000 |
| JP | 2000-249683 A | 9/2000 |
| JP | 2005-093229 A | 4/2005 |
| JP | 2006-197795 A | 7/2006 |
| JP | 2007-241411 A | 9/2007 |
| JP | 2008099981 A | 5/2008 |
| JP | 2008-234907 A | 10/2008 |

OTHER PUBLICATIONS

Japanese Office Action for JP2008-299435 mailed on Mar. 12, 2013.

* cited by examiner

CURRENT MEASURING CIRCUIT

This application is based upon and claims the benefit of priority from Japanese patent application No. 2008-299435, filed on Nov. 25, 2008, the disclosure of which is incorporated herein in its entirety by reference.

TECHNICAL FIELD

The present invention relates to a current measuring circuit suitable for measuring a current flowing through a high-voltage site to which a high voltage is applied.

BACKGROUND ART

A traveling-wave tube, a klystron, and the like are electron tubes used to amplify and oscillate a radio frequency signal through the interaction between an electron beam emitted from an electron gun and a high-frequency circuit. For example, as shown in FIG. 1, traveling-wave tube 1 is configured so as to include: electron gun 10 that emits electron beam 50; helix electrode 20 that is a high-frequency circuit that causes electron beam 50 emitted from electron gun 10 to interact with a radio frequency signal (microwave); collector electrode 30 that acquires electron beam 50 outputted from helix electrode 20; and anode electrode 40 that extracts electrons from electron gun 10 and, at the same time, guides electron beam 50 emitted from electron gun 10 to spirally-shaped helix electrode 20. Electron gun 10 includes: cathode electrode 11 that emits thermal electrons; and heater 12 that supplies cathode electrode 11 with thermal energy for emitting thermal electrons.

Electron beam 50 emitted from electron gun 10 is accelerated by a potential difference between cathode electrode 11 and helix electrode 20, introduced into helix electrode 20, and progresses through the inside of helix electrode 20 while interacting with a radio frequency signal inputted from one terminal of helix electrode 20. Electron beam 50 having passed through the inside of helix electrode 20 is acquired by collector electrode 30. At this point, a radio frequency signal amplified by the interaction with electron beam 50 is outputted from another terminal of helix electrode 20.

Power supply 60 includes: helix power circuit 61 that supplies cathode electrode 11 with helix voltage Vhel that is a negative direct voltage with respect to potential HELIX of helix electrode 20; collector power circuit 62 that supplies collector electrode 30 with collector voltage Vcol that is a positive direct voltage with respect to potential H/K of cathode electrode 11; and heater power circuit 63 that supplies heater 12 with heater voltage Vh that is a negative direct voltage with respect to potential H/K of cathode electrode 11. Helix electrode 20 is normally connected to a case of traveling-wave tube 1 and is grounded inside power supply 60.

While FIG. 1 shows a configuration example of traveling-wave tube 1 including one collector electrode 30, traveling-wave tube 1 may alternatively be configured so as to include a plurality of collector electrodes 30. In addition, while FIG. 1 shows a configuration in which anode electrode 40 and helix electrode 20 are connected inside power supply 60, a case is also possible where anode voltage Va that is a positive direct voltage with respect to potential H/K of cathode electrode 11 is supplied to anode electrode 40.

Helix voltage Vhel, collector voltage Vcol, and heater voltage Vh can be generated by, for example, a configuration that includes a transformer, an inverter that converts an externally supplied direct voltage into an alternating voltage and that supplies the alternating voltage to a primary winding of the transformer, and a rectifier circuit that converts an alternating voltage outputted from a secondary winding of the transformer into a direct voltage.

Meanwhile, a conceivable method of measuring a current flowing through a high-voltage site such as cathode electrode 11, collector electrode 30, heater 12, and the like in traveling-wave tube 1 shown in FIG. 1 involves inserting an ammeter in series between a measurement object electrode and a power circuit that supplies a predetermined direct voltage to the electrode.

However, with the method using an ammeter, since high voltage is also applied to the ammeter that measures currents flowing through cathode electrode 11, collector electrode 30, and heater 12 which operate at high voltage (several kVs to several tens of kV), measures such as insulating the ammeter need to be taken so as to ensure that the measurement operation is conducted in a safe manner. In addition, since an ammeter is normally used only when testing traveling-wave tube 1 or power supply 60, currents cannot be constantly monitored.

In consideration thereof, a method is conceivable in which current sensor 70 including a hall element or the like is fixed to, for example, wiring connecting cathode electrode 11 and helix power circuit 61, whereby flux generated when a current flows through the wiring is detected and the detected flux is converted into a current value.

However, current sensor 70 that detects a current using flux is disadvantageous in that current sensor 70 is also unintentionally affected by a peripheral magnetic field which makes it difficult to detect a small current. In addition, the fact that current sensor (hall element) 70 is generally expensive raises the cost of the entire high-frequency circuit system including traveling-wave tube 1 and power supply 60.

Japanese Patent No. 2711897 discloses a configuration for detecting an operating current of a traveling-wave tube in which a dedicated transformer for current detection (hereinafter referred to as a current-detecting transformer) is included in a power supply.

The power supply described in Japanese Patent No. 2711897 includes: a power supply transformer; an inverter that supplies power to a primary winding of the transformer; and a rectifier circuit that rectifies an alternating voltage outputted from a secondary winding of the transformer and generates a power voltage to be supplied to a cathode electrode and a collector electrode of a traveling-wave tube, and is configured such that a primary winding of a current-detecting transformer is inserted in series between the secondary winding of the transformer and the rectifier circuit. In such a configuration, a signal indicating a value substantially equal to a current flowing through the cathode electrode of the traveling-wave tube can be obtained from the secondary winding of the current-detecting transformer.

As described above, in the method of detecting a current using a current sensor, there are problems in that a small current is difficult to detect and that in the expensiveness of the current sensor (hall element) raises the cost of the entire high-frequency circuit system including the traveling-wave tube and the power supply.

Meanwhile, as described above, since the power supply described in Japanese Patent No. 2711897 is configured such that the primary winding of the current-detecting transistor is inserted in series between the secondary winding of the transformer and the rectifier circuit, a signal outputted from the secondary winding of the current-detecting transistor includes not only a value of the current flowing through the cathode electrode of the traveling-wave tube but also values of currents consumed by the current-detecting transistor and the rectifier circuit. Therefore, in the configuration described in Japanese Patent No. 2711897, it is hard to say that a current flowing through the cathode electrode of the traveling-wave tube is properly measured.

In addition, since the power supply described in Japanese Patent No. 2711897 uses a relatively expensive current-detecting transformer capable of also operating at high voltage (several kVs to several tens of kV), the cost of the entire high-frequency circuit system including the traveling-wave tube and the power supply rises.

Furthermore, the power supply described in Japanese Patent No. 2711897 is incapable of measuring a current flowing through electrodes other than the cathode electrode.

SUMMARY

In consideration of the above, an object of the present invention is to provide a current measuring circuit capable of accurately measuring a current flowing through a high-voltage site while preventing an increase in cost.

In order to achieve the object described above, a current measuring circuit according to an exemplary aspect of the present invention includes:

a current-detecting resistor inserted in series between a high-voltage site and an output terminal of a power circuit that supplies a predetermined direct voltage to the high-voltage site and which generates, between both ends thereof, a potential difference proportional to a current flowing through the high-voltage site;

a first resistor, a second resistor, a transistor, and a third resistor used to measure a current flowing through the high-voltage site and which are connected in series between a ground potential and an output terminal of the power circuit;

a differential amplifier that controls a current flowing through the transistor so that a potential difference generated between both ends of the third resistor becomes proportional to the potential difference generated between both ends of the current-detecting resistor; and a direct voltage source that generates a direct voltage for operating the differential amplifier.

The above and other objects, features, and advantages of the present invention will become apparent from the following description with reference to the accompanying drawings, which illustrate examples of the present invention.

EXEMPLARY EMBODIMENT

The present invention will now be described with reference to the drawings.

Figure 1:
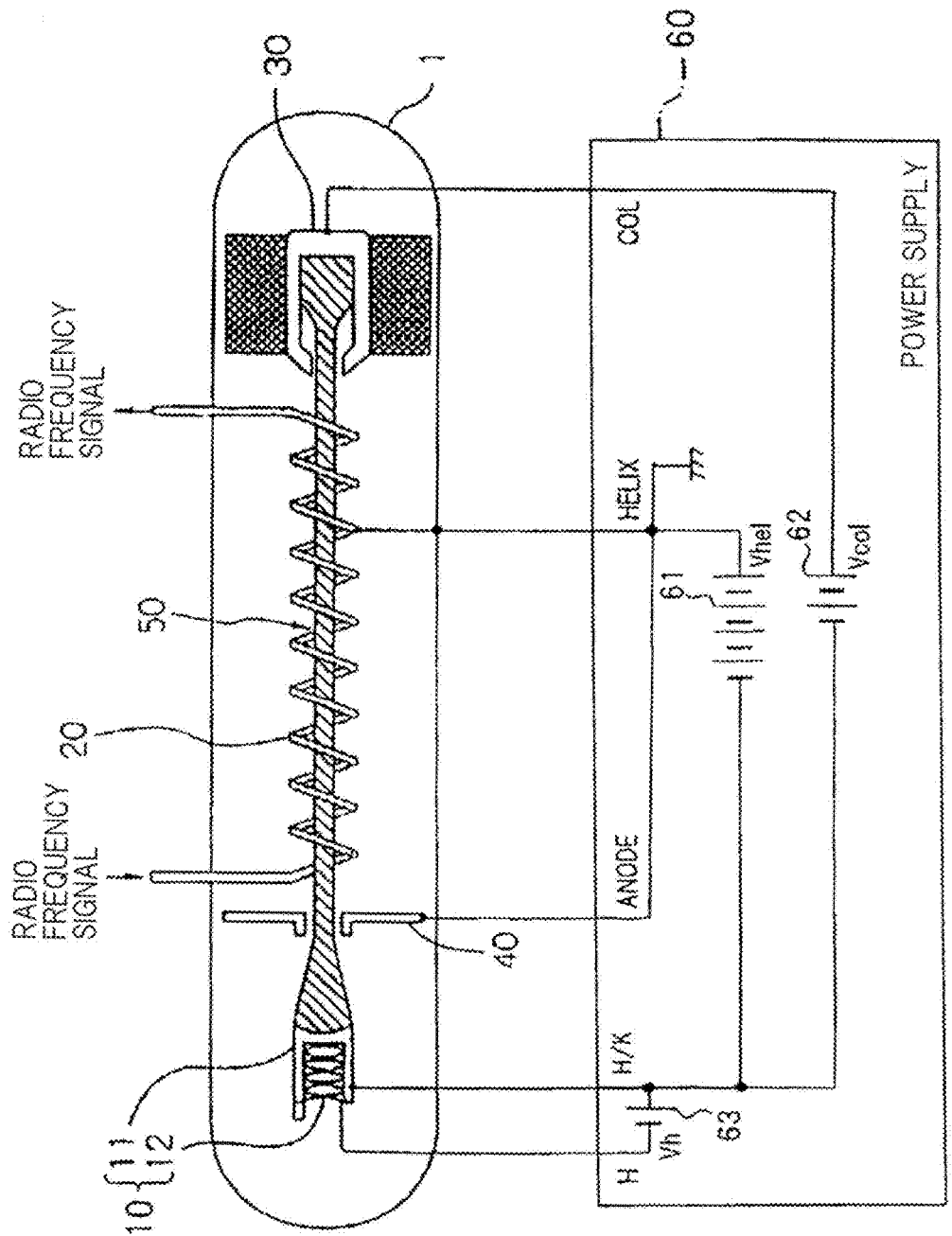
FIG. 1 is a block diagram showing a configuration example of a high-frequency circuit system of background art.
Figure 2:
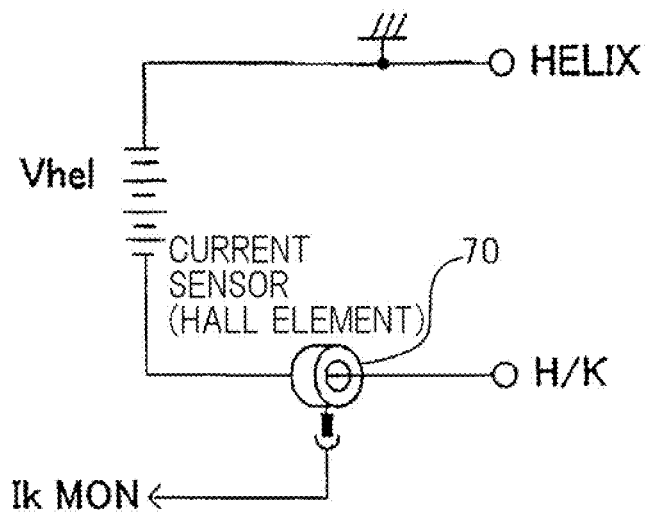
FIG. 2 is a schematic diagram showing an example of a current measuring circuit of background art.

Hereinafter, while a description will be given of an example in which currents flowing through the respective electrodes of traveling-wave tube 1 shown in FIG. 1 are to be measured, the present invention is not limited to measuring electrodes of traveling-wave tube 1 and is applicable to cases where currents flowing through other high-voltage sites are measured.

Figure 3:
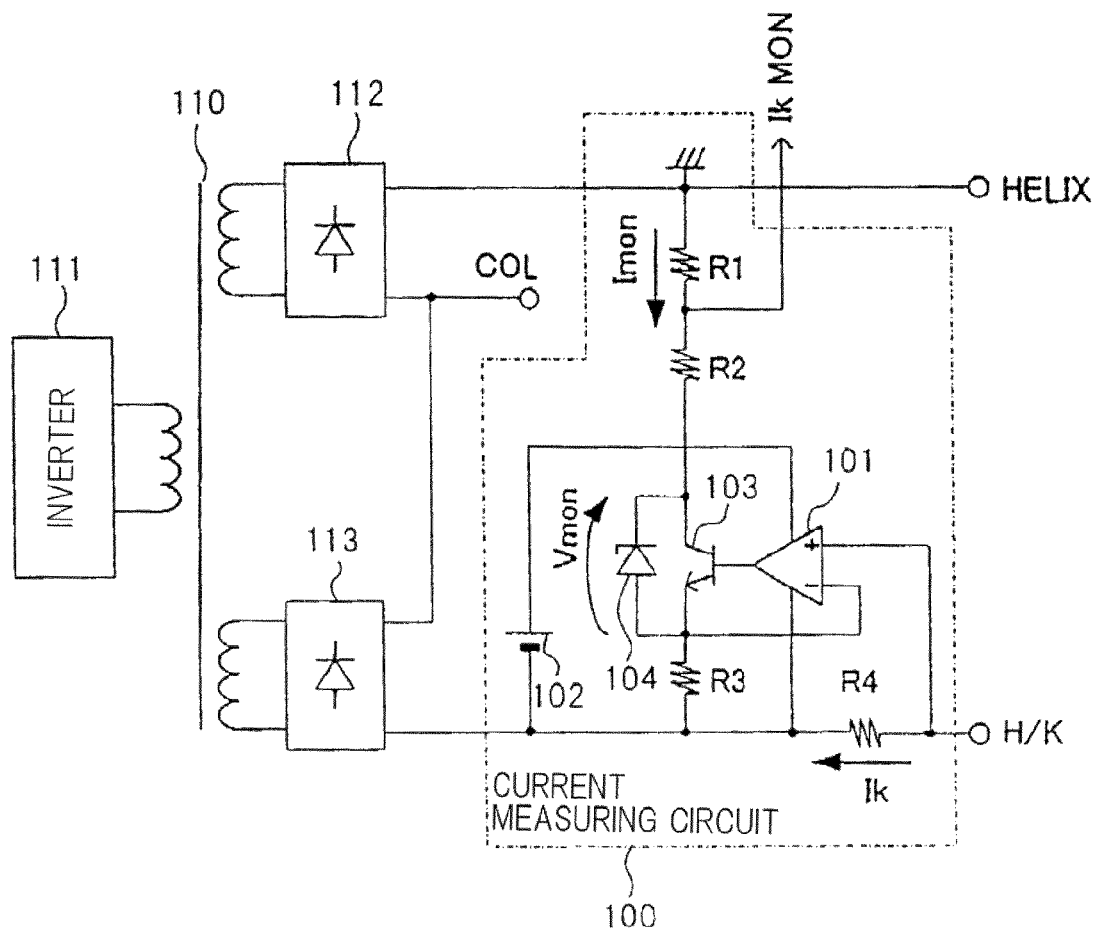
FIG. 3 is a block diagram showing an exemplary configuration of a current measuring circuit according to the exemplary embodiment.

FIG. 3 is a block diagram showing an exemplary configuration of a current measuring circuit according to the exemplary embodiment.

FIG. 3 shows a configuration example of a circuit for measuring a current (hereinafter referred to as a cathode current) flowing through a cathode electrode of the traveling-wave tube shown in FIG. 1. In addition, FIG. 3 shows a configuration which includes, as a power circuit that supplies a predetermined direct voltage to the cathode electrode and a collector electrode of the traveling-wave tube: transformer 110; inverter 111 that converts an externally supplied direct voltage to an alternating voltage and supplies the alternating voltage to a primary winding of transformer 110; and rectifier circuits 112, 113 that convert an alternating voltage outputted from a secondary winding of transformer 110 to a direct voltage. Configurations of a power circuit are not necessarily limited to the configuration shown in FIG. 3 and any circuit may be used as long as a predetermined direct voltage to be supplied to the respective electrodes can be generated.

As shown in FIG. 3, current measuring circuit 100 according to a first exemplary embodiment includes current-detecting resistor R4, differential amplifier 101, direct voltage source 102, transistor 103, zener diode 104, and resistors R1 to R3.

Current-detecting resistor R4 is inserted in series between the cathode electrode of the traveling-wave tube that is a high-voltage site whose current is to be measured and an output terminal of a helix power circuit (refer to FIG. 1) that supplies a direct voltage to the cathode electrode, and that generates, between both ends thereof, a potential difference proportional to cathode current Ik.

Resistor R1, resistor R2, transistor 103, and resistor R3 are to be used to measure the current flowing through a high-voltage site that is the current measurement object. Resistor R1, resistor R2, a collector-emitter of transistor 103, and resistor R3 are connected in series between ground potential (HELIX: a helix of the traveling-wave tube) and an output terminal (a terminal not connected to the cathode electrode of current-detecting resistor R4) of the helix power circuit.

An output signal of differential amplifier 101 is to be inputted to a base of transistor 103. While FIG. 3 shows a circuit example in which a bipolar transistor is used as transistor 103, a MOSFET (Metal-Oxide-Semiconductor Field-Effect Transistor) may be used as transistor 103.

A positive (+) input terminal of differential amplifier 101 is connected to the cathode electrode of the traveling-wave tube. A negative (−) input terminal of the differential amplifier is connected to a connection node of the emitter of transistor 103 and resistor R3. Feedback of an emitter voltage of transistor 103 to the negative (−) input terminal enables differential amplifier 101 to control current Imon flowing between the emitter and the collector of transistor 103 so that a potential difference generated between both ends of resistor R3 becomes proportional to the potential difference generated between both ends of current-detecting resistor R4 (in the configuration shown in FIG. 3, the potential differences are to become equal to each other).

Direct voltage source 102 generates a direct voltage that becomes a power voltage for operating differential amplifier 101. For example, as shown in FIG. 4, direct voltage source 102 is generated using, for example, an output voltage of a heater power circuit that supplies heater voltage Eh to a heater of the traveling-wave tube.

Normally, a negative direct voltage of around several kVs to several tens of kV with respect to potential H/K of the cathode electrode is supplied to the heater of the traveling-wave tube. Therefore, a direct voltage to be supplied to differential amplifier 101 as a power voltage can be generated using the alternating voltage outputted from the secondary winding of transformer 120 included in the heater power circuit.

Figure 4:
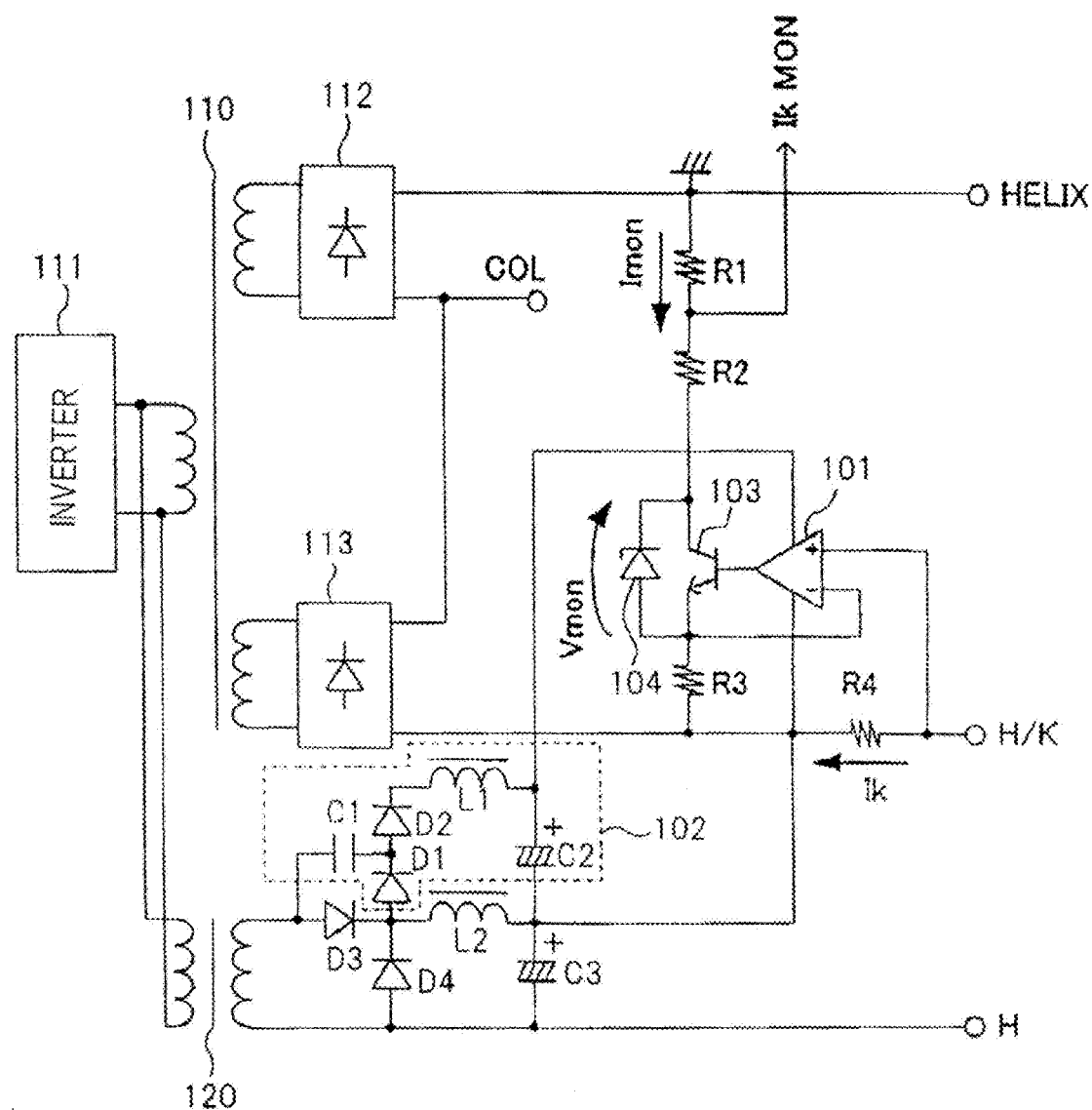
FIG. 4 is a circuit diagram showing a configuration example of a direct voltage source shown in FIG. 3.

Direct voltage source 102 shown in FIG. 4 includes diode D1, diode D2, capacitor C1, inductor L1, and capacitor C2. Direct voltage source 102 generates a direct voltage higher than potential (H/K) of the cathode electrode (close to the ground potential) by rectifying an alternating voltage outputted from the secondary winding of transformer 120 included in the heater power circuit with diode D1, diode D2, and capacitor C1, boosting the rectified voltage, and smoothing the voltage boosted by inductor. L1 and capacitor C2. Moreover, diode D3, diode D4, inductor L2, and capacitor C3 shown in FIG. 4 are a rectifier circuit that converts an alternating voltage outputted from the secondary winding of transformer 120 into a direct voltage.

Zener diode 104 is connected to the emitter-collector of transistor 103 and prevents damage to transistor 103 by limiting the voltage between the emitter and the collector of transistor 103 to or under a certain value. Zener diode 104 is unnecessary if excessive voltage can be prevented from being applied between the emitter and the collector of transistor 103 by other means.

In such a configuration, as described above, transistor 103 is connected in series to resistor R1, resistor R2, and resistor R3, and connected between the helix of the traveling-wave tube and the output terminal of the helix power circuit. Therefore, a current flowing between the emitter and the collector of transistor 103 becomes equal to the current flowing through resistors R1, R2, and R3. In addition, the helix power circuit supplies constant helix voltage Vhel to the cathode electrode.

Therefore, if the emitter-collector voltage of transistor 103 is denoted by Vmon, then a relation expressed by $$Vhel = Imon \times (R1+R2+R3) + Vmon \quad (1)$$

is true.

In addition, as described above, feedback of an emitter voltage of transistor 103 to the negative (−) input terminal enables differential amplifier 101 shown in FIG. 3 to control current Imon flowing between the collector and the emitter of transistor 103 so that a potential difference generated between both ends of resistor R3 becomes proportional to a potential difference generated between both ends of current-detecting resistor R4 (in this case, the potential differences are to become equal to each other).

Therefore, equation (2) below is true for cathode current Ik and current Imon flowing between the collector and the emitter of transistor 103.

$$Ik \times 4R = Imon \times R3 \quad (2).$$

Since resistance values of resistor R3 and current-detecting resistor R4 are fixed, it is now understood that current Imon flowing through resistors R1, R2, and R3 and between the collector and the emitter of the transistor shown in FIG. 3 varies in accordance with current Ik flowing through current-detecting resistor R4.

Therefore, by measuring the voltage of connection node (Ik MON) of resistor R1 and resistor R2 with respect to potential (HELIX: ground potential) of the helix of the traveling-wave tube, a value of cathode current Ik can be calculated from the measured value.

Specifically, if a voltage of the connection node of resistor R1 and resistor R2 is denoted by $V_{12}$, then $$V_{12} = R1 \times Imon \quad (3)$$

is true.

Therefore, from equations (2) and (3) above, cathode current Ik can be calculated by $$Ik = (R3/(R4 \times R1))V_{12} \quad (4).$$

With current measuring circuit 100 according to the present exemplary embodiment, a current flowing through a high-voltage site such as a cathode electrode of a traveling-wave tube can be measured by simplified circuitry. In addition, since current measuring circuit 100 according to the present exemplary embodiment can be configured using generic parts such as a resistor, a differential amplifier, and a transistor, an increase in cost can be reduced to a minimum.

Moreover, in the description above, while a configuration example has been shown in which a direct voltage to be supplied to differential amplifier 101 is generated as shown in FIG. 4 using an output voltage (alternating voltage) of a heater power circuit as direct voltage source 102, heater voltage (direct voltage) Vh generated by the heater power circuit can be directly supplied as the power voltage to differential amplifier 101.

Figure 5:
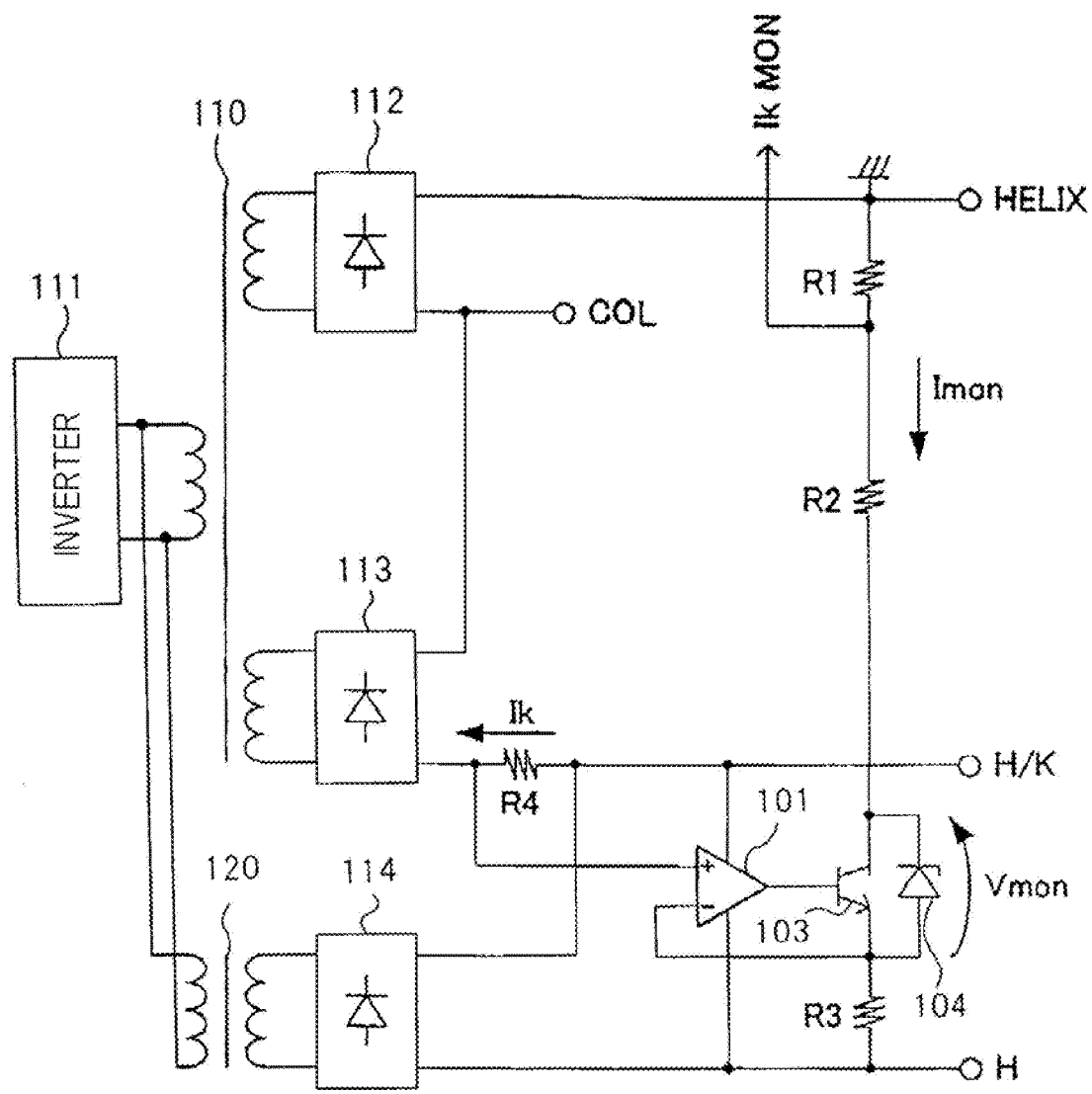
FIG. 5 is a block diagram showing another exemplary configuration of a current measuring circuit according to the exemplary embodiment.

In this case, as shown in FIG. 5, it will suffice that resistor R1, resistor R2, the transistor, and resistor R3 connected in series be connected between the helix of the traveling-wave tube and an output terminal of the heater power circuit (an output terminal of rectifier circuit 114), and the positive (+) input terminal of the differential amplifier be connected to an output terminal of the helix power circuit (a terminal not connected to the cathode electrode of current-detecting resistor R4).

Since direct voltage source 102 becomes unnecessary in a configuration in which heater voltage (direct voltage) Vh generated by the heater power circuit is supplied to differential amplifier 101, circuit size can be reduced compared to current measuring circuit 100 shown in FIG. 3 and FIG. 4 and the cost of current measuring circuit 100 can be further reduced.

In addition, while a configuration example in which a current flowing through the cathode electrode of a traveling-wave tube has been shown in the description above, in addition to the measurement of a current flowing through the cathode electrode, the current measuring circuit according to the exemplary embodiment can be realized with a similar configuration when measuring a current flowing through the collector electrode or the heater.

Figure 6:
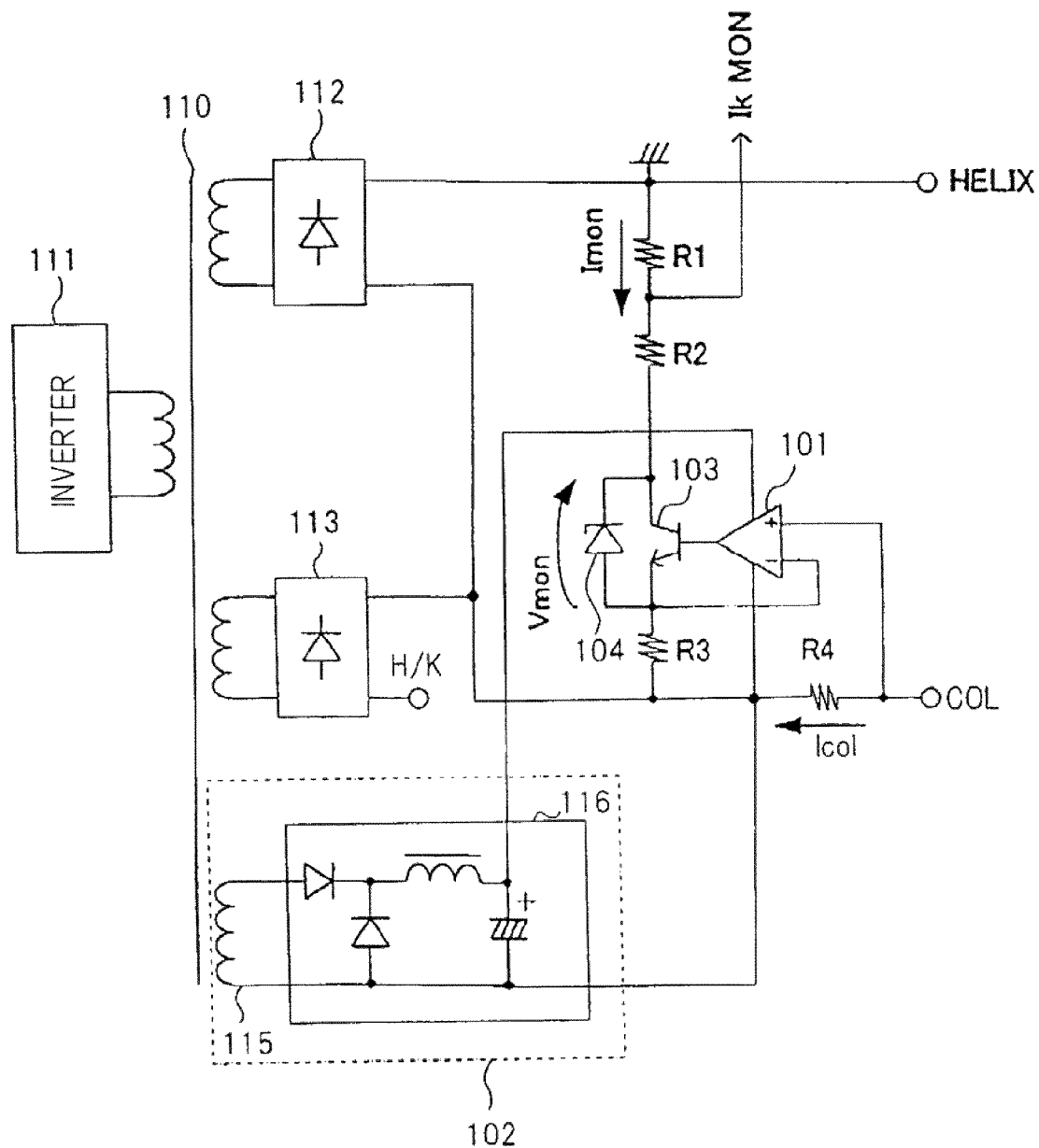
FIG. 6 is a block diagram showing another exemplary configuration of a current measuring circuit according to the exemplary embodiment.

For example, when measuring current Icol flowing through the collector electrode, as shown in FIG. 6, current-detecting resistor R4 is inserted in series between the collector electrode and an output terminal of a collector power circuit (refer to FIG. 1) that supplies a predetermined direct voltage to the collector electrode, and resistor R1, resistor R2, the transistor, and resistor R3 connected in series are connected between the helix (ground potential) of the traveling-wave tube and an output terminal of the collector power circuit. Then, current Imon flowing between the collector and the emitter of transistor 103 need only be controlled so that a potential difference generated by differential amplifier 101 between both ends of resistor R3 becomes proportional to a potential difference generated between both ends of current-detecting resistor R4.

In this case, it will suffice if direct voltage source 102 generates a direct voltage for operating differential amplifier 101 by adding secondary winding 115 for outputting an alternating voltage for generating a direct voltage higher than (having a difference of around several kVs to several tens of kV) collector voltage Vcol and for converting an alternating voltage outputted from secondary winding 115 into a direct voltage using known rectifier circuit 116.

Figure 7:
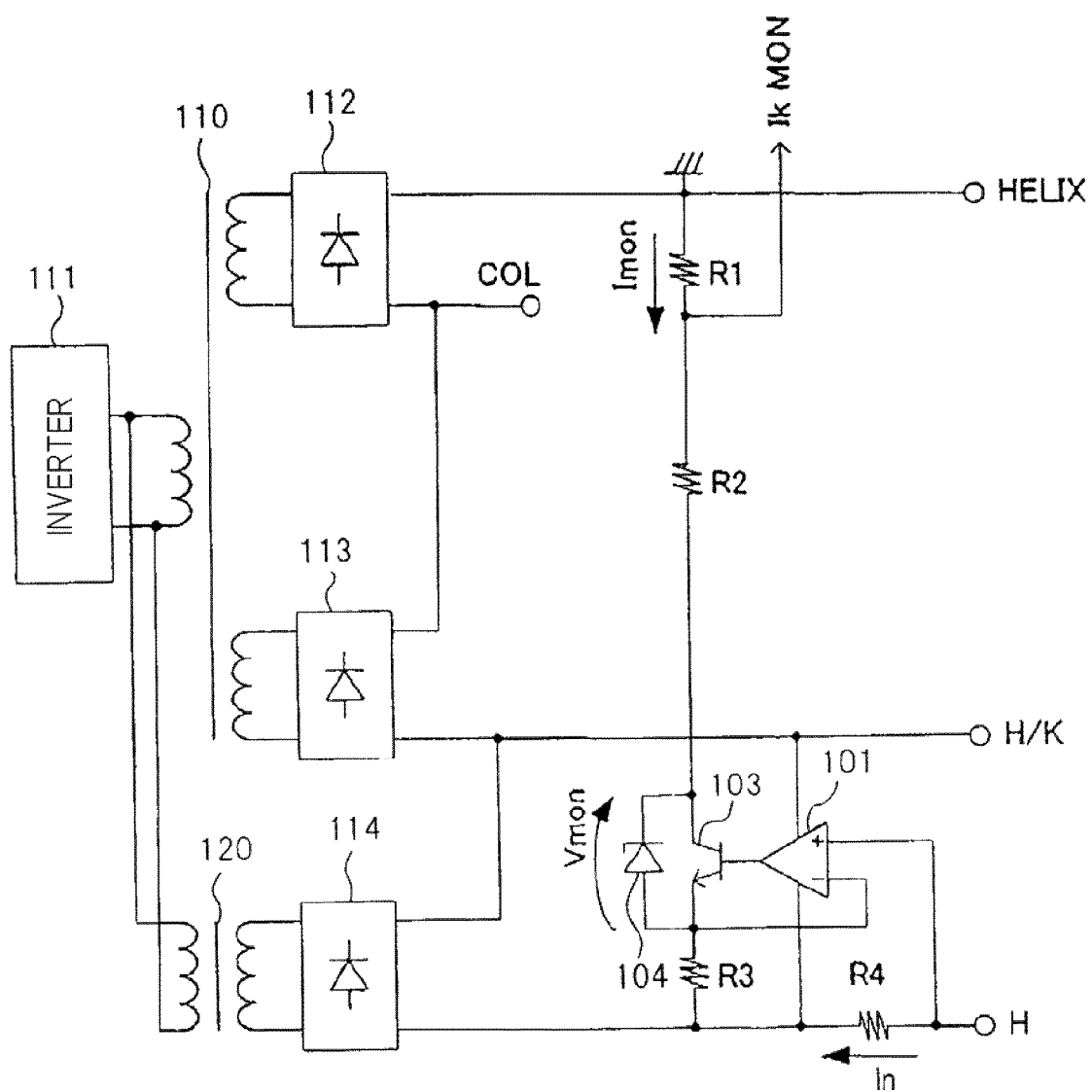
FIG. 7 is a block diagram showing another exemplary configuration of a current measuring circuit according to the exemplary embodiment.

On the other hand, when measuring current Ih flowing through the heater, as shown in FIG. 7, current-detecting resistor R4 is inserted in series between the heater and an output terminal (output terminal of rectifier circuit 114 shown in FIG. 7) of the heater power circuit (refer to FIG. 1) that supplies a predetermined direct voltage to the collector electrode, and resistor R1, resistor R2, the transistor, and resistor R3 connected in series are connected between the helix (ground potential) of the traveling-wave tube and the output terminal of the heater power circuit. Then, in the same manner as described above, only current Imon flowing between the collector and the emitter of transistor 103 needs be controlled so that a potential difference generated by differential amplifier 101 between both ends of resistor R3 becomes proportional to a potential difference generated between both ends of current-detecting resistor R4.

In this case, supplying heater voltage Vh outputted from the heater power circuit to differential, amplifier 101 as a power voltage will suffice.

In addition, as described above, current measuring circuit 100 according to the present exemplary embodiment can be configured using small generic parts such as a resistor, a differential amplifier, and a transistor. Therefore, for example, current measuring circuit 100 according to the present exemplary embodiment can be mounted on any device in a high-frequency circuit system including a traveling-wave tube and a power supply that supplies a predetermined direct voltage to respective electrodes of the traveling-wave tube.

Figure 8:
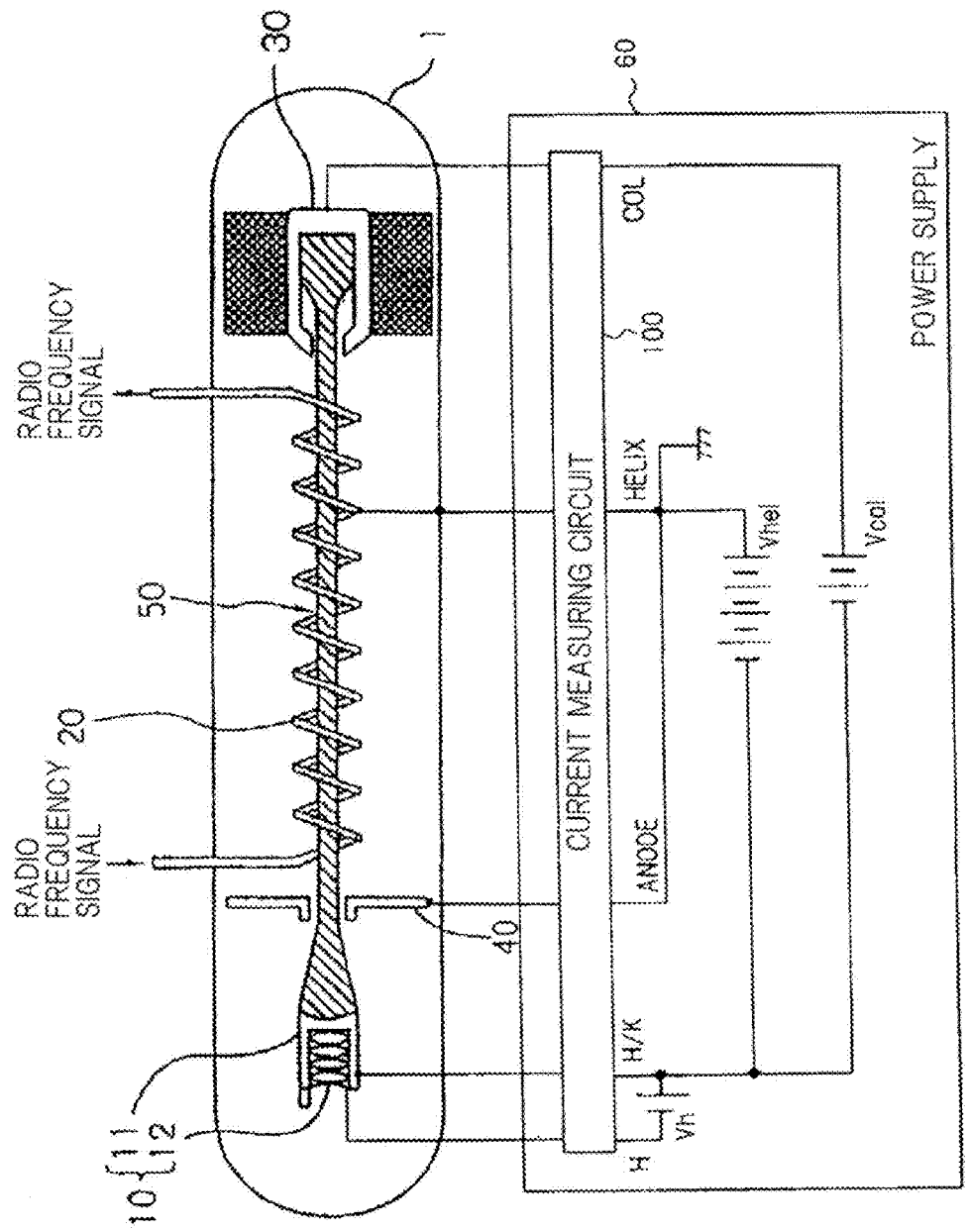
FIG. 8 is a block diagram showing an exemplary configuration of a high-frequency circuit system according to the exemplary embodiment.
Figure 9:
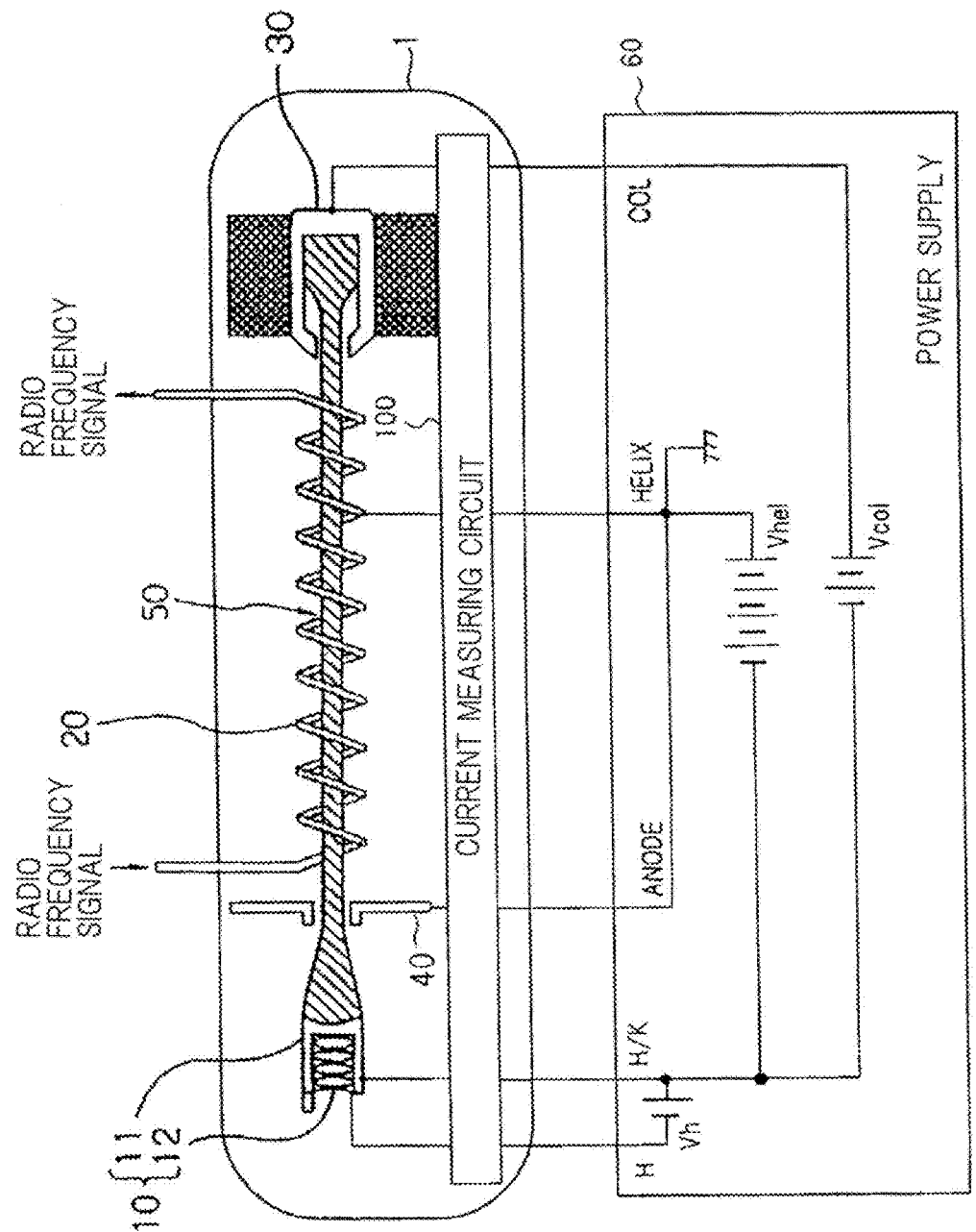
FIG. 9 is a block diagram showing another exemplary configuration of a high-frequency circuit system according to the exemplary embodiment.

Specifically, current measuring circuit 100 according to the present exemplary embodiment may include power supply 60 that respectively supplies a predetermined direct voltage to the cathode electrode, the collector electrode, and the heater of traveling-wave tube 1 as shown in FIG. 8 or may be incorporated into traveling-wave tube 1 as shown in FIG. 9.

While the invention has been particularly shown and described with reference to exemplary embodiments thereof, the invention is not limited to these embodiments. It will be understood by those ordinarily skilled in the art that various changes in form and details may be made therein without departing from the spirit and scope of the present invention as defined by the claims.

What is claimed is:

1. A current measuring circuit comprising:
    a current-detecting resistor inserted in series between a high-voltage site and an output terminal of a power circuit that supplies a predetermined direct voltage to the high-voltage site and which generates, between both ends thereof, a potential difference proportional to a current flowing through the high-voltage site;
    a first resistor, a second resistor, a transistor, and a third resistor used to measure a current flowing through the high-voltage site and which are connected in series between a ground potential and the output terminal of said power circuit;
    a differential amplifier having a negative input terminal into which a first potential difference which is generated between both ends of said third resistor is entered, and having a positive input terminal into which a second potential difference which is generated between both ends of said current-detecting resistor is entered, and controlling a current flowing through the transistor which is connected to the output of said differential amplifier so that said first potential difference and said second potential difference become equal; and
    a direct voltage source that generates a direct voltage for operating said differential amplifier.

2. A power supply comprising:
    the current measuring circuit according to claim 1; and
    a power circuit that supplies a predetermined direct voltage to said high-voltage site.

3. A high-frequency circuit system comprising:
    the power supply according to claim 2; and
    an electron tube including a helix connected to a ground potential, and a cathode electrode, a collector electrode, and a heater constitute said high-voltage site.

4. The high-frequency circuit system according to claim 3, wherein
    said high-voltage site whose current is to be measured is the cathode electrode included in said electron tube, and
    said direct voltage source generates a direct voltage for operating said differential amplifier from an output voltage of a heater power circuit that supplies a predetermined direct voltage to the heater.

5. The high-frequency circuit system according to claim 3, wherein
    said high-voltage site whose current is to be measured is the cathode electrode included in the electron tube, and
    a heater power circuit that supplies a predetermined direct voltage to the heater is also used as the direct voltage source.

6. The high-frequency circuit system according to claim 3, wherein
    said high-voltage site whose current is to be measured is the heater included in the electron tube, and
    a heater power circuit that supplies a predetermined direct voltage to the heater is also used as the direct voltage source.

7. An electron tube comprising:
    the current measuring circuit according to claim 1;
    a helix connected to a ground potential; and
    a cathode electrode, a collector electrode, and a heater constitute said high-voltage site.

8. A high-frequency circuit system comprising:
    the electron tube according to claim 7; and
    a power supply that respectively supplies a predetermined direct voltage to said cathode electrode, said collector electrode, and said heater included in said electron tube.

9. The high-frequency circuit system according to claim 8, wherein
    said high-voltage site whose current is to be measured is the cathode electrode included in said electron tube, and said direct voltage source generates a direct voltage for operating said differential amplifier from an output voltage of a heater power circuit that supplies a predetermined direct voltage to the heater.

10. The high-frequency circuit system according to claim 8, wherein said high-voltage site whose current is to be measured is the cathode electrode included in the electron tube, and a heater power circuit that supplies a predetermined direct voltage to the heater is also used as the direct voltage source.

11. The high-frequency circuit system according to claim 8, wherein said high-voltage site whose current is to be measured is the heater included in the electron tube, and a heater power circuit that supplies a predetermined direct voltage to the heater is also used as the direct voltage source.

12. The current measuring circuit according to claim 1, wherein the voltage of the connection node of said first resistor and said second resistor is measured with reference to ground potential, and the current flowing through said high-voltage site is calculated from the measured value.

\* \* \* \* \*